United States Patent
Song

(10) Patent No.: US 12,124,942 B2
(45) Date of Patent: Oct. 22, 2024

(54) SERIALIZED NEURAL NETWORK COMPUTING UNIT

(71) Applicant: ANAFLASH INC., San Jose, CA (US)

(72) Inventor: Seung-Hwan Song, Palo Alto, CA (US)

(73) Assignee: Anaflash Inc., San Jose, CA (US)

(*) Notice: Subject to any disclaimer, the term of this patent is extended or adjusted under 35 U.S.C. 154(b) by 934 days.

(21) Appl. No.: 17/109,114

(22) Filed: Dec. 1, 2020

(65) Prior Publication Data

US 2021/0166110 A1 Jun. 3, 2021

Related U.S. Application Data

(60) Provisional application No. 62/942,923, filed on Dec. 3, 2019.

(51) Int. Cl.
| | |
|---|---|
| *G06N 3/063* | (2023.01) |
| *G06F 7/544* | (2006.01) |
| *G06N 3/04* | (2023.01) |
| *G11C 11/22* | (2006.01) |
| *G11C 11/54* | (2006.01) |

(52) U.S. Cl.
CPC ............ *G06N 3/063* (2013.01); *G06F 7/5443* (2013.01); *G06N 3/04* (2013.01); *G11C 11/54* (2013.01); *G06F 2207/4824* (2013.01); *G11C 11/2293* (2013.01)

(58) Field of Classification Search
CPC .......... G06N 3/04; G06N 3/045; G06N 3/063; G06N 3/08; G06F 7/5443; G06F 2207/4824; G06F 17/16; G11C 11/54
See application file for complete search history.

(56) References Cited

U.S. PATENT DOCUMENTS

| | | | |
|---|---|---|---|
| 11,521,050 B2* | 12/2022 | Chang | G06N 3/065 |
| 2019/0042160 A1* | 2/2019 | Kumar | G06F 3/0659 |
| 2020/0301667 A1* | 9/2020 | Hung | G11C 16/0416 |

* cited by examiner

*Primary Examiner* — Emily E Larocque

(57) ABSTRACT

A serialized neural network computing unit is disclosed. This computing unit comprises: a bit line; a memory array having a plurality of memory blocks, each memory block have one or more than one memory cells, each cell connected to the bit line; a control circuit configured to: apply a serialized input to the memory cells in a sequence such that outputs of the memory cells are produced in a sequence in response to the serialized input, wherein each of the outputs corresponds to a multiplication of the input and a weight value stored in the memory cell; and set a group of reference current levels, each having a specific current amount, for the control circuit to control the memory cells in generating respective output currents corresponding to the set of reference current levels.

20 Claims, 12 Drawing Sheets

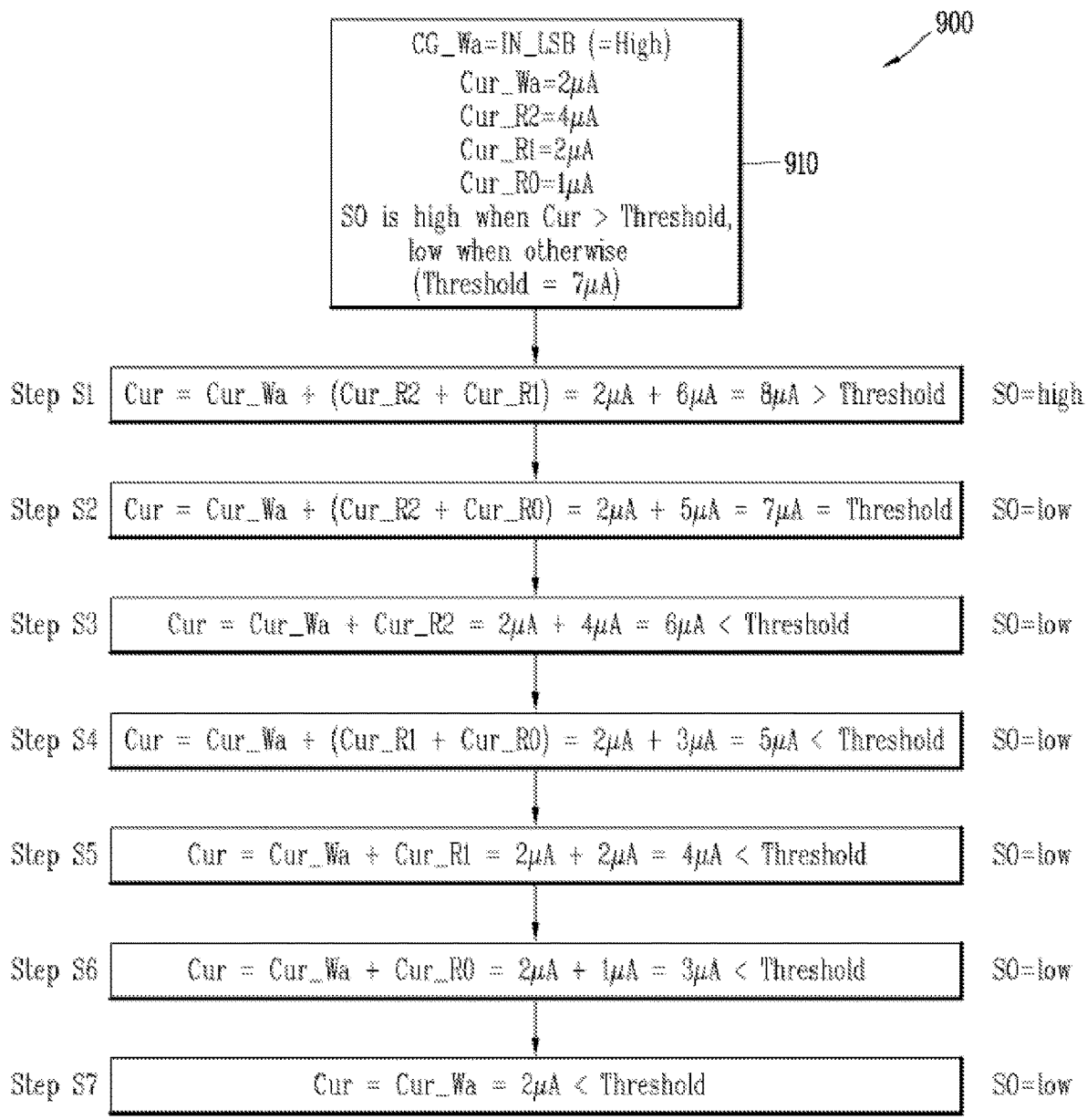

SERIALIZED NEURAL NETWORK COMPUTING UNIT

CROSS-REFERENCE TO RELATED APPLICATION

This application claims the benefits of U.S. Provisional Application Ser. No. 62/942,923, filed on Dec. 3, 2019, entitled "Serialized nonvolatile neural network computing unit."

TECHNICAL FIELD OF THE INVENTION

This invention describes the serialized neural network computing unit that the input, weight, and output patterns are serialized such that a neural network computing unit can be implemented using a digital input signal, a low precision memory cell and a traditional 1-bit sense amplifier circuit of the memory array, not requiring complicated high precision digital-to-analog and analog-to-digital converter circuits in the row and column circuit of the memory array having high precision memory cells.

BACKGROUND OF THE INVENTION

A neural network computing unit is increasingly used in artificial intelligence and machine learning applications. The main part of the computing is massive multiply-and-accumulate (MAC) operations between input data and corresponding trained weight values. One way proposed to achieve such MAC operations efficiently is a compute-in-memory architecture where the computation is performed in the place that the data is stored. In the prior art, the MAC computing block deploying compute-in-memory architecture uses a memory cell as a synapse cell of the neural network that performs a multiplying operation of analog input data and analog weight values generates a resulting analog output current. Accumulation operation can be performed by current summation on the bit-line of the memory array in an analog domain.

However, prior MAC computing device requires complicated high precision (e.g. 4, 8, 16, or 32 bits) digital-to-analog and analog-to-digital converter circuits to convert an associated signal between digital and analog domains since the rest of the computing system communicates with the MAC computing block in the digital domain. The digital domain data can be represented as large as 4, 8, 16, or 32-bit information. Also, the previous MAC computing block requires high precision (e.g. 4, 8, 16, or 32 bits) synaptic device where 4, 8, 16, or 32-bit information can be stored in a single synaptic device. Therefore, the efficiency of the MAC engine deployed with the compute-in-memory architecture has been significantly limited by the availability of the high precision digital-to-analog and analog-to-digital converter circuits and the high precision synaptic devices.

SUMMARY OF INVENTION

This invention discloses a neural network computing unit. According to the present invention, a neural network computing unit comprises: a bit line; a memory array having a plurality of memory blocks, each memory block have one or more than one memory cells, each cell connected to the bit line; a control circuit configured to: apply a serialized input to the memory cells in a sequence such that outputs of the memory cells are produced in a sequence in response to the serialized input, wherein each of the outputs corresponds to a multiplication of the input and a weight value stored in the memory cell; and set a group of reference current levels, each having a specific current amount, for the control circuit to control the memory cells in generating respective output currents corresponding to the set of the reference current levels.

In one embodiment, the control circuit is further configured to apply a serialized voltage input to the memory cells in a sequence such that each of the output currents of the memory cell is produced in a sequence corresponding to the voltage input, wherein the output current corresponds to a multiplication of the voltage input and a weight value stored in the memory cell. In one embodiment, the computing unit further comprises a sensing circuit for sequentially receiving output currents of the memory cells in the bit line. In one embodiment, the computing unit further comprises an accumulator circuit coupled to the sensing circuit, the accumulator circuit is configured to convert the received output current values in a thermometer code to a binary code. In one embodiment, the accumulator circuit is further configured to accumulate the converted values in a bit-shifted manner defined by the control circuit.

In one embodiment, the computing unit further comprises: a main synapse block including a plurality of memory cells connected to a common bit line; and the control circuit is further configured to serially apply a plurality of streamed voltage inputs corresponding to a plurality of a serial input data to respective ones of the plurality of cells in the synapse array. In one embodiment, a most significant bit of the serial input data is first entered into the corresponding cell. In one embodiment, the neural network computing unit finishes computation without fully computing the least significant bit. In one embodiment, the computing unit further comprise: a reference synapse block including a plurality of reference cells connected to the bit line, wherein the cells are programmed to generate the same or different predefined output current to the bitline; and, the control circuit is further configured to apply a plurality of input voltages corresponding to a plurality of a serial input data to a plurality of reference cells in the reference synapse array selected.

In one embodiment, the control circuit is further configured to deactivate or activate none, one, or multiple reference cells to produce respective outputs corresponding to reference levels defined by the control circuit. In one embodiment, the output levels from the reference cells are binary weighted. In one embodiment, the sensing circuit is further configured to sense a sum of an output current of a memory cell in a first of the memory block and an output current of a memory cell in a second of the memory block.

In one embodiment, the sensing circuit is further configured to obtain a sum of (i) an output current of the memory cell corresponding to one bit of the serial input data applied to the first of the memory block and (ii) an output current of the reference cell corresponding to each of reference levels for a duration of the one bit of the serial input data applied to the second of the memory block. In one embodiment, the sensing circuit is further configured to: obtain the summed output currents in the bit line; produce a comparison result between a threshold current level specified and the summed output current level; and convert the comparison result into a corresponding binary signal. In one embodiment, the sensing circuit is further configured to set a number of iterations of (i) comparison between the threshold current level and the summed output current level and (ii) converting the comparison result into the corresponding binary signal based on the result.

In one embodiment of the present invention, an apparatus comprises: an array of memory cells including: a bit line; a first set of memory cells, each connected to the bit line; a second set of memory cells, each connected to the bit line; a control circuit; a first set of control lines connecting the control circuit to the first set of memory cells, wherein the control circuit is configured to apply a voltage input data in a serial format to the first set of memory cells in a sequence such that output currents are produced in a sequence in response to the voltage input data, wherein the output currents corresponds to multiplications of the voltage input data and the respective memory cell's weights; and a second set of control lines connecting the control circuit to the second set of memory cells, wherein the control circuit is configured to set a group of reference current levels, each having a specific current amount, such that the control circuit controls the second set of memory cells to generate respective output currents corresponding to the group of reference current levels; and a sensing circuit for receiving output currents from the first and second set of memory cells in the bit line.

In one embodiment, the memory cell is a Flash memory, a resistive change memory, a FeFET memory, or a logic transistor with a weight memory, each programmed to produce a certain output current specified, in one embodiment, the apparatus further comprises an accumulator circuit coupled to the sensing circuit, wherein the accumulator circuit is configured to receive processed signal values from the sensing circuit in a bit-shifted manner defined by the control circuit. In one embodiment, the sensing circuit is further configured to serially receive and compare a respective one of the output currents in the bit line with a threshold predefined. In one embodiment, the accumulator circuit is further configured to perform converting the received signal values from a thermometer code to a binary code and accumulates the converted values in a bit-shifted manner defined by the control circuit.

BRIEF DESCRIPTION OF THE DRAWINGS

Features of the present invention will become apparent to those skilled in the art from the following description regarding the drawings. Understanding that the drawings depict only typical embodiments of the invention and are not, therefore, to be considered limiting in scope, the invention will be described with additional specificity and detail through the use of the accompanying drawings, in which:

FIG. 9 describes another embodiment of a process of comparing the measured sum of the current in the bitline with the set of preset threshold currents according to the present invention.

FIG. 1 is a block diagram of one embodiment of a Neural Network Computing Unit in accordance with the present invention. The Computing Unit 100 includes Controller 110, Main Synapse Array 120, Reference Synapse Array 140, Sensing Circuit 140, and Accumulator Circuit 150.

The Controller 110 is in communication with the Main Synapse Array 120, Reference Synapse Array 130, Sensing Circuit 140 and Accumulator Circuit 150. The Main Synapse Array 120 may include single or multiple synapse cells to represent a specific parameter value altogether. The Reference Synapse Array 130 may consist of single or multiple reference cells to represent a specific reference value altogether. The Main and Reference Synapse Arrays 120, 130 can receive serialized digital input sequence signals from the Controller 110. The outputs corresponding to the input sequence signals from the Main and Reference Synapse Arrays 120,130 can be accumulated in the shared Bit Line BL connected to the Sensing Circuit 140.

The Sensing Circuit 140 is configured to apply one or more than one threshold levels that are calibrated by the Controller 110. The Sensing Circuit 140 receives the serialized signals from the bitline BL sequentially and produces its serialized output (SO) sequence using the threshold level configured from the Controller 110. The Accumulator Circuit 150 receives the serialized output SO value from the Sensing Circuit 140 and accumulates the values in its output node (AO) in a bit-shifted manner configured by another control signal from the Controller 110.

In addition, the Controller 120 may include key subblocks such as a register, a data memory, a code memory, a one-time-programmable or read-only or other nonvolatile memory, a timing circuit, or a digital processing circuit. A register can store a key configuration for the Controller 120 to perform the intended operation. Data memory can store the digital input data to be provided to the Main and Reference Synapse Arrays 120,130. The code memory is configured to store the operation sequence of the Controller 110. The one-time-programmable or read-only or other nonvolatile memory can store the reference current level of the Sensing Circuit 140 and may be further configured to store the serialization sequence order or timing information of the input digital sequence signal (e.g. MSB first, CSB first, or LSB first), the parameter selection sequence signal (e.g. MSB first, CSB first, or LSB first), or the reference digital sequence signal (e.g. low level first, or middle level first, or high level first). The MSB input digital signal and the MSB parameter selection signal may enter first, since the result from the MSB data contributes the entire result most significantly, which enables the Controller to stop sending the digital sequence signals before finishing the full operation sequence signals with LSB data in case the accuracy of the output can be compromised for higher performance. When the input sequence is stopped before finishing the operations with LSB data, the intermediate accumulator output signal on the AO node can represent approximately good enough overall output from the Computing Unit.

Figure 4:
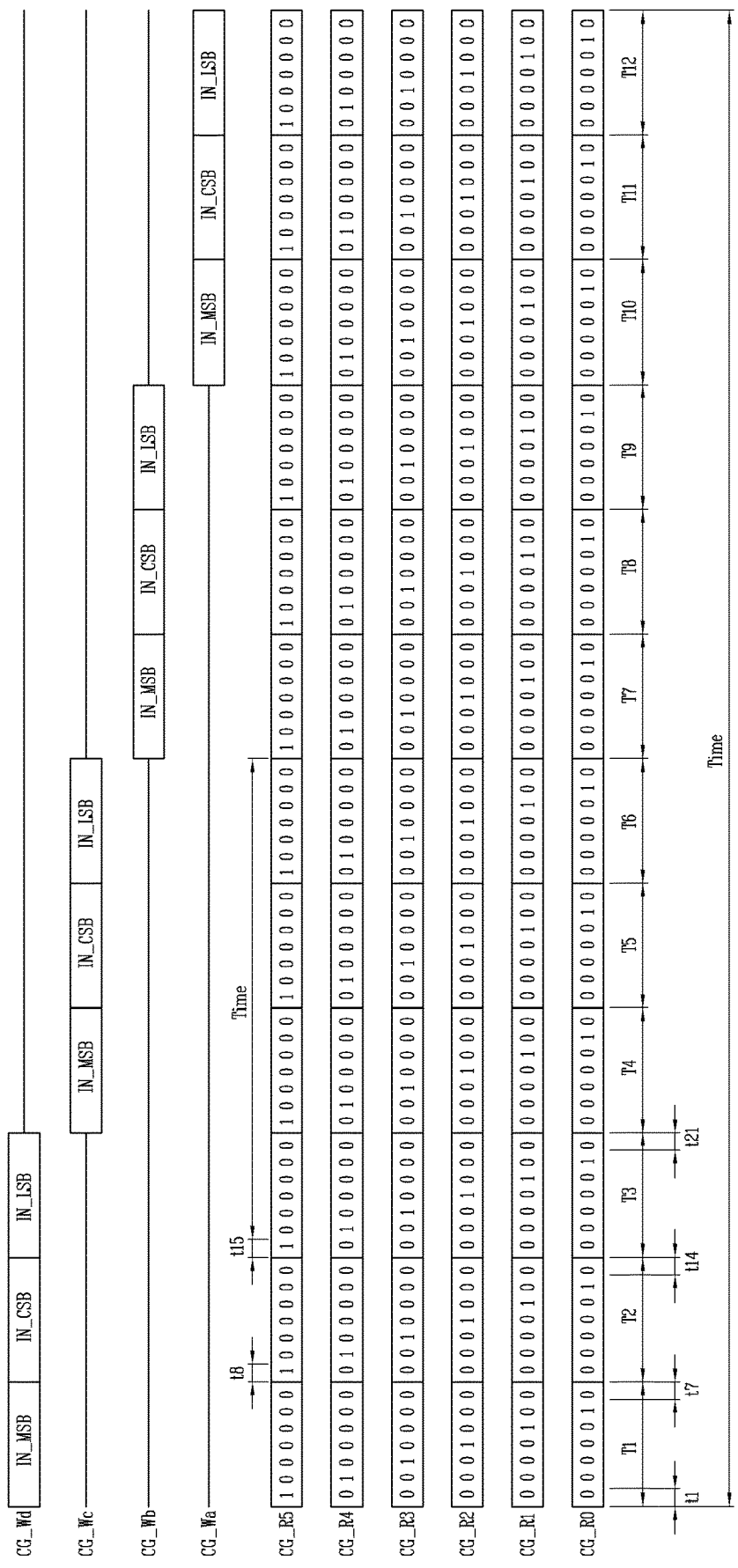
FIG. 4 is a timing diagram illustrating the operation of the computing circuit of FIG. 1, according to one embodiment of the present invention.

The timing circuit can check the operation sequence and modulate key signal pulses according to the specified timing (e.g. timing of the operation shown in FIG. 4). The digital processing circuit can retrieve the information from the register, the data or code memory, the one-time-programmable or read-only or other nonvolatile memory, or the timing circuit and have the capability of error detecting or correcting, compression or decompression, encryption or decryption, pattern detecting or counting, filtering, modulating, Boolean logic operation, etc., such that the Controller 110 can have the bit-serialized digital sequence signals to the Main and Reference Synapse Arrays 120,130, and the control signals to the Sensing and Accumulator Circuits 140,150 resiliently and efficiently. The definition and use of such key subblocks of the Controller 110 are well-known to those skilled in the art and shouldn't be limited to the specific description or forms described here.

Figure 1:
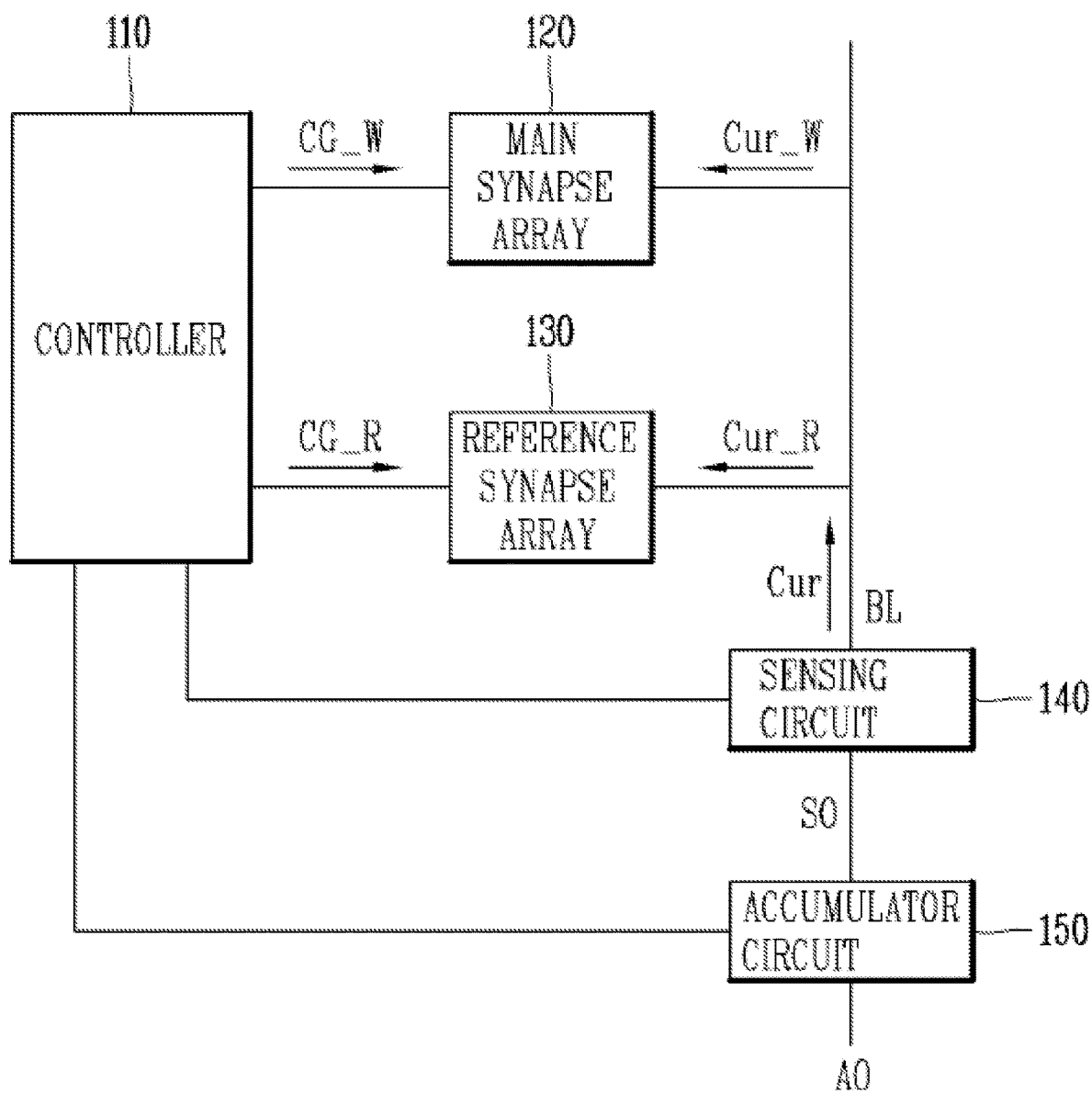
FIG. 1 is a block diagram of one embodiment of a Neural Network Computing Unit in accordance with the present invention.

Although a single blitline BL is defined as a single line for associating the circuit elements in the Computing Unit 100, a plurality of bitlines BL can be connected in parallel to compute multiple columns simultaneously. Thus, each column may share the common serialized digital input and reference sequence signals and the control signals from the Controller 110. On the other hand, the signal on the BL can represent either positive or negative value of the information. Even though the single bit line (i.e., BL) is depicted in FIG. 1, the synapse array may have two different output bit lines (i.e., BL_P and BL_N) such that one line (i.e., BL_P) carries positive information and the other line (BL_N) carries negative information. In this case, the sensing circuit takes the difference between the two-line signals as an input of it.

Also, even though a single set of Main Synapse Array 120 is depicted in FIG. 1, multiple sets of the Main Synapse Array 120 can be connected in parallel to represent multiple parameters and accumulate multiple sets simultaneously in the shared Bit Line BL. Thus, each set of Main Synapse Arrays 120 can have serialized digital input sequence signals each.

Further, the Main and Reference Synapse Arrays may have multiple input signal lines from the Controller 110 such that sign information of the input data along with its magnitude information can be carried to the Synapse arrays. In one embodiment, the set of cells in the Main Synapse Array 120 sequentially receive a plurality of input signals from the Controller 110. The Controller 120 sequentially sends n-bit (binary) input data to each of the synapse memory cells in the Main Synapse Array 120 such that a corresponding cell generates an output current signal corresponding to a function of input multiplied by the cell's weight stored. While supplying the n-bit input signal to each selected cell in the Main Synapse Array 120, the Controller 120 synchronizes the cells' operations in the Main Synapse Array 120 and the Reference Synapse Array 130. The Controller 110 simultaneously transmits a plurality of reference sequence signals to the set of reference cells in the Reference Synapse Array 130, wherein the signals activate none, one, or multiple corresponding reference cells to set a reference synapse current level sequentially per each step.

Multiple reference synapse current levels are sequentially applied by sending the plurality of reference sequence signals to the Reference Synapse Array 130 while one bit of the n-bit inputs is being supplied to the selected cell in Main Synapse Array 120. The Controller 120 controls the set of cells in Reference Synapse Array 130 in that each reference synapse level is to be sequentially adjusted once while one of the n-bits of the input is processed by the selected cell in the Main Synapse Array 120.

FIGS. 2A to 2H show diagrams of exemplary synapse cells in accordance with an embodiment of the present invention using various memory cells such as logic Flash, logic NAND Flash, NAND Flash, NOR Flash, resistive change memory with a transistor, resistive change memory without a transistor, Ferroelectric FET (FeFET) memory, and logic transistors with a weight memory (W). Each synapse cell can flow an appropriate current level (i.e., Cur_W) to the bit line (BL) depending on the control line input signal (i.e., CG or CGx) and the stored weight value in the memory as a form of a threshold voltage (for Flash memories), a resistor (for resistive change memory), a polarization (for FeFET memory), or a conductance (for logic transistors with a weight memory).

Figure 2A:
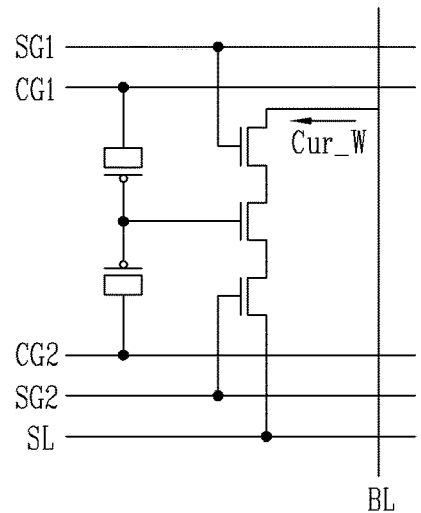
FIGS. 2A to 2H show diagrams of exemplary synapse cells in accordance with an embodiment of the present invention using various memory cells.

FIG. 2A shows a synapse cell using logic Flash memory programmed at the current level Cur_W. The current level represents the multiplication of an input signal and a weight parameter. Here, the input signal is applied through a pair of signal lines CG1 and CG2. The weight parameter is stored in the logic Flash memory cell. The output current Cur_W is supplied to the BL.

Figure 2B:
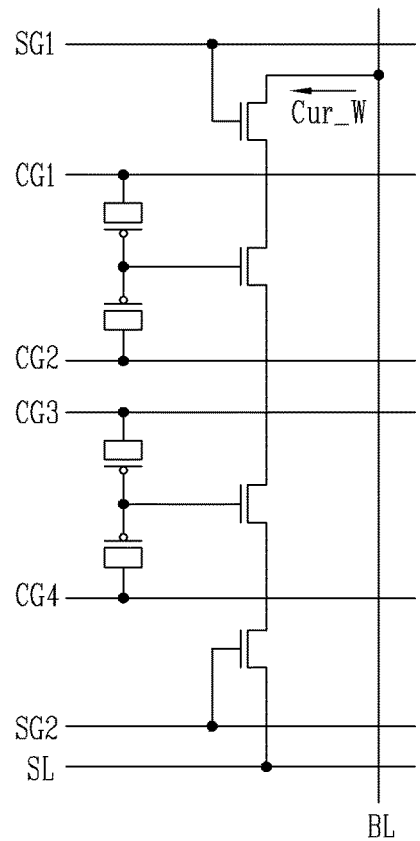

FIG. 2B shows a synapse cell using logic NAND Flash programmed at the current level Cur_W. The current level represents the multiplication of an input signal and a weight parameter. Here, the input signal is applied through one selected pair among multiple signal line pairs (i.e., either pair of CG1/2 or CG3/4). The weight parameter is stored in the selected logic NAND Flash memory cell. The output current Cur_W is supplied to the BL by turning on all other unselected cells and top/bottom switching transistors connected to SG1/2.

Figure 2C:
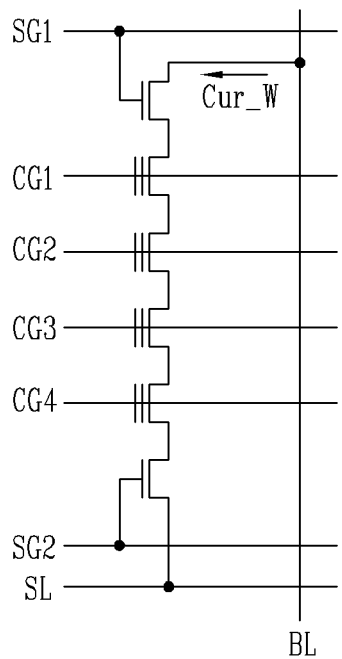

FIG. 2C shows a synapse cell using NAND Flash programmed at the current level Cur_W. The current level represents the multiplication of an input signal and a weight parameter. Here, the input signal is applied through one selected signal line among multiple signal lines (CG1~CG4). The weight parameter is stored in the selected NAND Flash memory cell. The output current Cur_W is supplied to the BL by turning on all other unselected cells and top/bottom switching transistors connected to SG1/2.

Figure 2D:
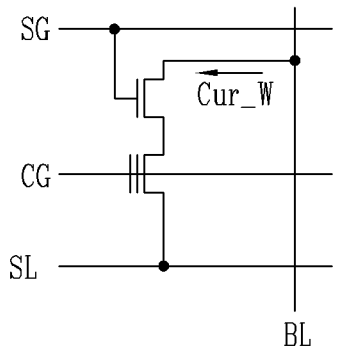

FIG. 2D shows a synapse cell using NOR Flash programmed at the current level Cur_W. The current level represents the multiplication of an input signal and a weight parameter. Here, the input signal is applied through the signal line CG. The weight parameter is stored in the NOR Flash memory cell. The output current Cur_W is supplied to the BL by turning the switching transistor connected to SG.

Figure 2E:
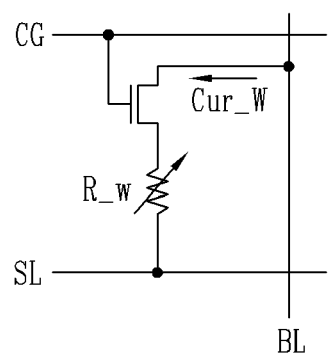

FIG. 2E shows a synapse cell using resistive change memory with a transistor programmed at the current level Cur_W. The current level represents the multiplication of an input signal and a weight parameter. Here, the input signal is applied through the signal line CG. The weight parameter is stored in the variable resistor (R_w). The output current Cur_W is supplied to the BL by turning the switching transistor connected to CG.

Figure 2F:
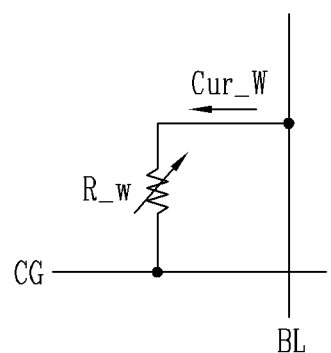

FIG. 2F shows a synapse cell using resistive change memory without a transistor programmed at the current level Cur_W. The current level represents the multiplication of an input signal and a weight parameter. Here, the input signal is applied through the signal line CG. The weight parameter is stored in the variable resistor (R_w). The output current Cur_W is supplied to the BL.

Figure 2G:
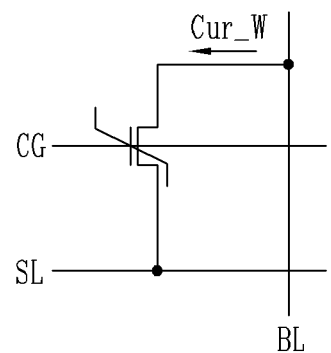

FIG. 2G shows a synapse cell using FeFET memory programmed at the current level Cur_W. The current level represents the multiplication of an input signal and a weight parameter. Here, the input signal is applied through the signal line CG. The weight parameter is stored in the FeFET memory. The output current Cur_W is supplied to the BL.

Figure 2H:
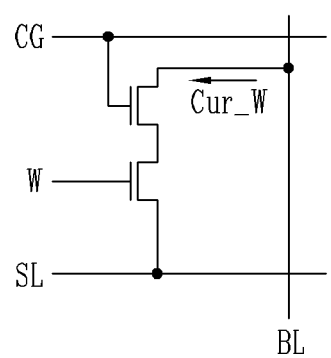

FIG. 2H shows a synapse cell using logic transistors with a weight memory (W) programmed at the current level Cur_W. The current level represents the multiplication of an input signal and a weight parameter. Here, the input signal is applied through the signal line CG. The weight parameter is stored in the weight memory W. The output current Cur_W is supplied to the BL by turning the switching transistor connected to CG.

In addition to the depicted synapse cell, other types of synapse cells that are carefully programmed to the target current levels corresponding to the weight parameters of the neural network can be deployed.

Figure 3:
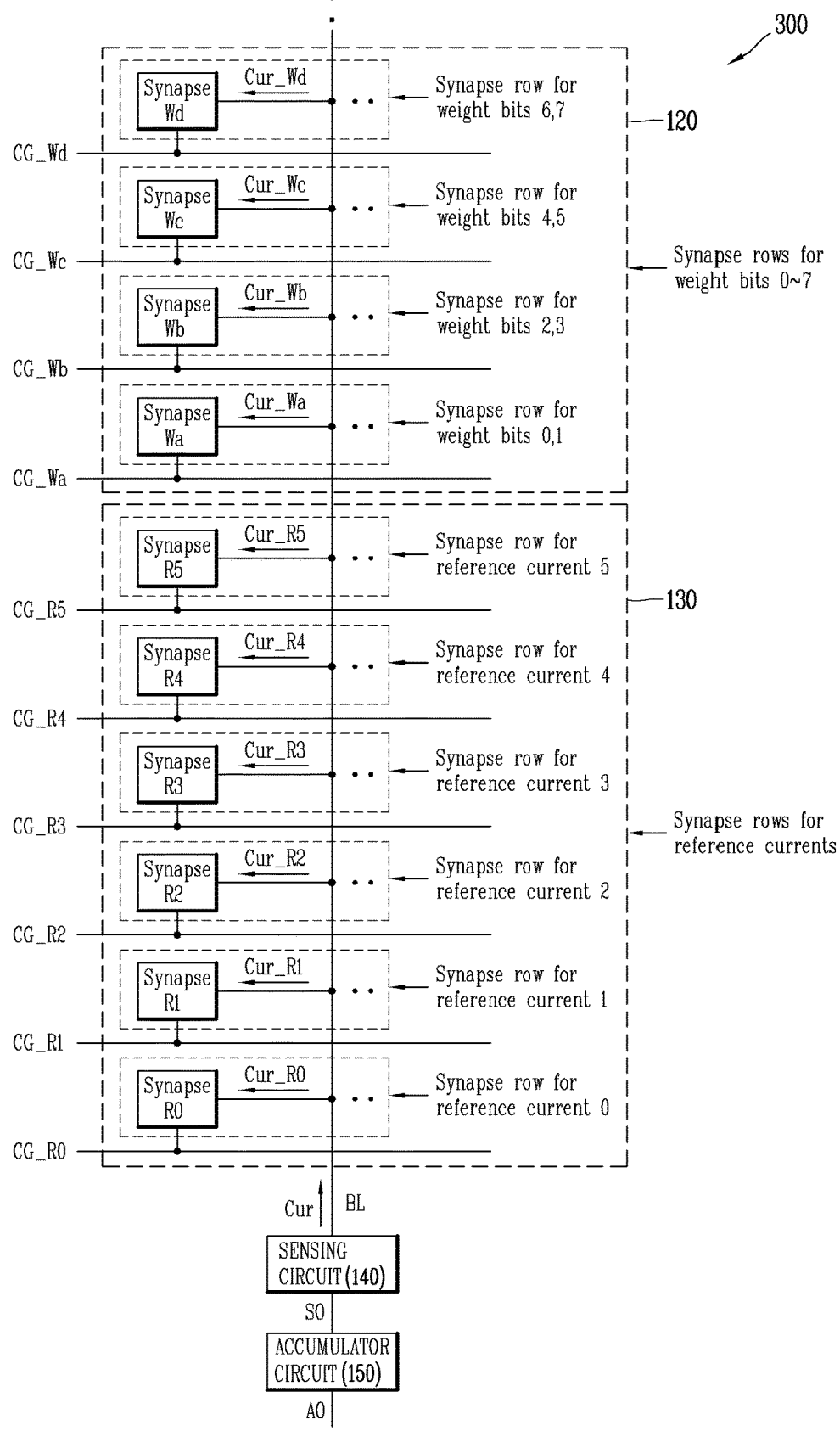
FIG. 3 is a simplified block diagram of the Synapse Memory Array in accordance with an embodiment of the present invention.

FIG. 3 is a simplified block diagram of the Synapse Memory Array in accordance with an embodiment of the present invention.

In one embodiment, Main Synapse Array 120 includes four synapse cells Wa, Wb, Wc, and Wd. They are connected through the common bitline BL, and receive input sequence signals through the coupled signal lines CG_Wa, CG_Wb, CG_Wc, CG_Wd, respectively. Further, Reference Synapse Array 130 includes six reference cells R0, R1, R2, R3, R4 and R5, connected through the bitline BL, and receive reference sequence signals through the coupled signal lines CG_R0, CG_R1, CG_R2, CG_R3, CG_R4 and CG_R5, respectively. Sense Amplifier 140 is connected to the BL, and generates its output (SO) to the line connected to an Accumulator 150. The Accumulator 150 is configured to accumulate the serialized partial sums to generate the accumulator output AO.

It should be noted that the number of the Arrays 120,130 can be more than one, expanded along rows and columns. Either or both of the Arrays 120, 130 can be arranged in single or multiple forms in rows and columns depending on various specific technical needs. Here, the Main Synapse Array 120 comprises four synapse cells Wa, Wb, Wc and Wd, and the Reference Synapse Array 130 includes six synapse cells R0, R1, R2, R3, R4 and R5. Although the Arrays 120, 130 in FIG. 3 is depicted as having four and six cells, respectively, and they may consist of more or fewer memory cells described herein depending on the cell's capacity to store weight values and the available area of the Arrays.

The synapse cells in both Arrays 120,130 are connected in series and share the common bit line BL. Each synaptic cell in the Arrays 120, 130 can store a fixed or adjustable synaptic weight and generate an output, which is a function of the input multiplied by that weight. Further, in one embodiment of the present invention, each of the inputs applied to the plurality of cells through the signal lines (i.e., CG_Wa, CG_Wb, CG_Wc, CG_Wd) has a time interval specified. Therefore, output currents corresponding to the inputs will flow on the bitline BL, respectively, at the time interval specified.

The total number of synapse cells in the Main Synapse Array 120 may be adjusted depending on each cell's capacity. For instance, when it comes to assigning an 8-bit weight to the Main Synapse Array 120, and if an available memory cell can store two-bit information having four logic states, the Main Synapse Array 120 may then need a total of 4 memory cells to perform a related multiplication operation. However, the Main Synapse Array 120 may need two memory cells if the cell can store four bits of information with 16 logic states. Also, eight synaptic cells are required if each cell stores 1-bit information having 2 logic states.

FIG. 3 shows the case in which 8-bit weight is provided; each cell is configured to store 2-bit information; thus, a total of 4 cells are arranged in the Main Synapse Array 120 to perform the corresponding multiplication related. In one embodiment, the Reference Synapse Array 130 includes a group of the reference synapse cells R0, R1, R2, R3, R4, and R5. They can be the same as or similar to the synapse cells of the Main Synapse Array 120. Those reference cells are coupled to the reference signal lines (i.e., CG_R0 through CG_R5), respectively, sharing the common bitline BL. Each reference synapse cell outputs a specific reference current on the output line BL because each has its own specific synaptic weights when receiving a voltage via the corresponding signal line. Here, each of the six reference cells in the Reference Synapse Array 130 can be set up to generate incrementally different currents. For instance, from the top to bottom order in the string, the activated reference cell R5 is configured to output 6 µA; the activated reference cell R4 can output 5 µA; the activated reference cell R3 can output 4 µA; the activated reference cell R2 can output 3 µA; the activated reference cell R1 can output 2 µA; and, the activated reference cell R0 can output 1 µA.

The Sensing Circuit 140 may determine whether a sensed output current in the bitlinte BL is more or less than a threshold value, which is a predefined or calibrated value by the Controller 110. In one embodiment, regarding the interactions between synapse memory cells in the Main Synapse Array 120 and reference memory cells in Reference Synapse Array 130, the Controller 110 may be configured to:

1. Select a sequential order of operations between the synapse memory cells in the Main Synapse Array 120 to activate.
2. Define a set of Reference Synapse Levels (output current set values to be obtained by none, one, or more than one reference synapse cells).
3. Selectively operates the reference cell in the Array 130 such that the selectively combined reference cells are to simultaneously generate the output current that is the same current defined in the reference level.
4. Controls the reference cells' operations while the selected synapse memory cell in the Main Synapse Array 120 is under process.
5. Pursue each one of the different currents in the bit line BL, which are set by the reference levels, by activating none of the reference memory cells, selectively activating some reference cell(s), or activate all of the reference cells in the Reference Synapse Array 130

In another embodiment, based on the preset orders stored, the Controller 110 can provide the sequential operational input and reference signals to those Main and Reference Synapse Arrays 120,130 one by one in a predetermined order. This sequential activation of those cells is predetermined or can be reset by the user. By selectively applying the voltage input on the signal line, the Controller 110 controls a selected main synapse cell (e.g., weight A) to generate the output, which is a function of the input multiplied by the parameter stored in the main synapse cell. The Controller 110 synchronizes the activation of the set of reference cells to the operation of the selected weight cell. That is, the Controller 110 may enable sequential activation of the set of reference cells R0 through R5 step-by-step, while the selected synaptic cell generates an output current corresponding to an input voltage applied via the signal lines. Multiple synapse rows can be activated together to flow the accumulated current in the BL.

FIG. 4 is a timing diagram illustrating the operation of the computing circuit of FIG. 1 according to one embodiment of the present invention.

Here, from the top to the fourth row of the diagram indicates the signal lines (CG_Wd, CG_Wc, CG_Wb, CG_Wa) carrying a 3-bit input signal for the cells (Wa, Wb, Wc and Wd) in the Main Synapse Array 120. The 3-digit input value is represented by Most Significant Bit (MSB), Center Significant Bit (CSB), Least Significant Bit (LSB). Also, each of the six rows between a 5th row (titled "CG_R5") and the bottom of the diagram (titled "CG_R0") shows serial binary input data entered into the set of reference cells (R5, R4, R3, R2, R1, R0) via the signal lines (CG_R5, CG_R4, CG_R3, CG_R2, CG_R1, CG_R0), respectively.

In one embodiment, the Controller 110 sequentially activates none, one or more of the reference synapse cells (R0, R1, R2, R3, R4, and R5) to generate a predefined reference synapse level in the bitline BL while one of the selected cells (Wd, Wc, Wb, and Wa) receive the 3-bit input signal to generate a corresponding output current, which is the function of the 3-bits input multiplied by the weight stored in the cell.

More specifically, during the time period T1, the Controller 110 sends a binary input occupying the MSB (IN_MSB) to the cell Wd for generating a current of the binary input multiplied by a weight stored in the cell Wd via the bitline. During the time period T2, the Controller 110 sends a binary input occupying the CSB (IN_CSB) to the cell Wd via the signal line CG_Wd, and as a result, the cell Wd generates a current of the binary input multiplied by a weight stored in the cell Wd via the bitline. During the time period T3, the Controller 110 sends a binary input occupying the LSB (IN_LSB) to the cell Wd via the signal line CG_Wd, and as a result, the cell Wd generates a current of the binary input multiplied by a weight stored in the cell Wd via the bitline. The sending of a 3-bit input signal to the synaptic cell Wc is performed over the period T4 to T6; the sending of a 3-bit input signal to cell Wb is performed over the period T7 to T9; and, the sending of a 3-bit input signal to the synaptic cell Wa is performed over the period T10 to T12. The sending of 3-bit input signal transmission for the cells Wa, Wb and Wc are performed similarly to the sending of the 3-bit input signal to Wd as described, as depicted in FIG. 4.

As shown in FIG. 4, when the time T1 period is divided into a total of 7 sub-time periods of t1 through t7, the Controller 110 may direct the operation of none, one or multiple of the set of cells (R0, R1, R2, R3, R4, and R5) corresponding to each of the 7 sub-time periods. In other words, the Controller 110 can send a set of signals to the set of the cells (R5, R4, R3, R2, R1 and R0) such that the cell(s) having signal 1 are collectively activated to set the predetermined reference synapse level of the current in the bit line BL, which is to be added to the output current from the selected cell, one of the cells Wd, Wc, Wb, and Wa, activated by the 3-bit input signal. In the binary sequence input data for the cells (R5, R4, R3, R2, R1 and R0), "1" indicates an enabling signal, and "0" indicates an idle signal for a corresponding cell.

During a time period t1, the Controller 110 operates the synaptic cell Wd (by supplying IN_MSB input signal) and the reference cell R5 (by supplying enabling 1 data signal) to output. Thus, the sum of the output currents of these cells is generated during the time t1. And, during each of the time periods t2 to t7, the Controller 110 keeps transmitting the IN-MSB input signal to the Wd synapse cell and enables cells R4, R3, R2, R1, R0, and none to sequentially operate to output the corresponding output currents.

During the time period T2, the Controller 110 sends the IN_CSB signal to the cell Wd and sequentially transmits the input signal 1 to each of the R5 to R0 cells, and all '0' to the cells during the period t8 to t14, forming the period T2. During the time period T3, the Controller 110 sends the IN_LSB signal to the cell Wd and sequentially transmits the input signal 1 to each of the R5 to R0 cells, and all '0' to the cells during the period t15 to t21, forming the period T3. And, the Controller 110 for the remaining periods T4 to T12, the same pattern of the Controller's operation performed during the periods T1 to T3 is applied to the remaining cells (Wc, Wb, and Wa).

Figure 5:
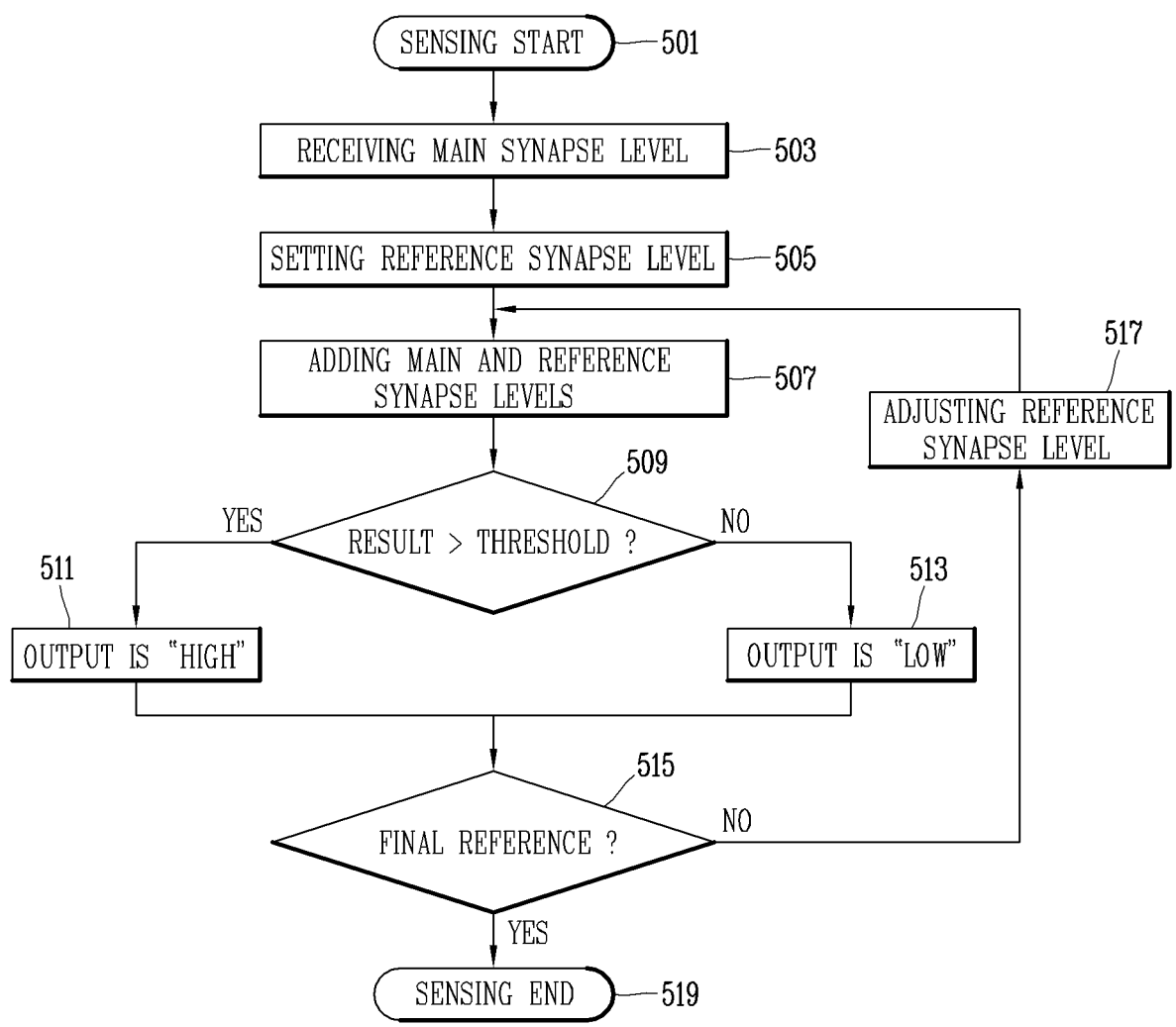
FIG. 5 is a flow chart describing one embodiment of a process for serialized sensing operations according to the present invention.

FIG. 5 is a flow chart describing one embodiment of a process for serialized sensing operations according to the present invention. Please note that a plurality of the Main synapse arrays 120 and the Reference synapse array 130 are arranged in a plurality of rows and columns in the Neural Network Computing Unit 100. Please also note that the number of cells in the Main and Reference Synapse Arrays are preset or determined by either the Controller 110 or by the user by an interface associated with the Neural Network Computing Unit 100 (not shown).

At Step 501, the Sensing Circuit 140 is set "ON" mode to start a sensing/correction operation. At Step 503, Main Synapse Level refers to a certain output current to be obtained by a corresponding synapse memory cell in the Main Synapse Array 120. When receiving it, the Sensing Circuit 140 may identify the amount of the output current which corresponds to the function of the input (one of the n-bit input applied to the synapse cell) multiplied by a weight stored in the selected cell.

At Step 505, the Controller 110 may set the Reference Synapse Levels (a set output current values to be obtained by none, one, or more than one reference cells). To obtain the output currents specified by the Synapse Levels, the Controller 110 may set a combination of none, one, or more than one reference cell in Reference Synapse Array 130. When the set output current is obtained by combining the reference cells, the Controller 110 may calculate the ideal number of reference cells. For instance, to produce an output with a 3-bit format that is a function of the input (e.g., 3-bit input) multiplied by weights stored in the synapse cells in the Main Synapse Array 120, the Controller 110 may set a total of seven reference synapse levels (7 output current set values) and perform associated operations according to the programmed equation, e.g., the total reference synapse levels $S=2^{(3)}-1$, which is 7. The operation of the Controller 110 in deciding (1) a number of times to perform the sensing steps and (2) the number of reference synapse levels can be implemented via predefined program code or can manually be entered by the user as needed.

At Step 507, the Controller 120 may operate the cells in Arrays 120, 130 to combine (1) the output current from the Reference Synapse Arrays 130 and (2) the output current from the Main Synapse Array 120. In other words, the output current defined by the specified Reference Synapse level is to be added to the output current from the selected synapse memory cell in the Main Synapse Array 120 in the bit line BL.

At Step 509, the Sensing Circuit 140 may compare the added output current measured at a specific time T to a preset threshold current value. The Sensing Circuit 140 may store the threshold current value or allow the user to enter a new threshold current value or reset the preset threshold current values.

At Step 511, upon finding that the measured sum of output current is greater than the preset threshold value, the Sensing Circuit 140 may record this comparison result as a binary signal, such as H. On the other hand, at Step 513, when finding that the measured sum of output current is not greater than the preset threshold value the Controller 120 records this comparison result as a binary signal, such as L.

At Step 515, the Sensing Circuit 140 may check whether all the predefined reference synapse levels have undergone the adding and comparing Steps 507 and 509. As described in FIG. 4, for instance, when the adding/comparison steps for the reference synapse level associated with cell R5 is finished, those steps are then to be applied to the reference synapse level associated with cell R4, and then, for the cells R3, R2, R1, R0, and none.

At Step 517, upon finding that the comparison operation hasn't applied to all preset reference synapse levels, the Sensing Circuit 140 adjusts the reference synapse level by activating a different set of reference cells to proceed before repeating the operations of steps 507 through 515. Step 519 is when the operations of all preset reference synapse levels are completed.

At Step 519, all preset operations of the selected main synapse cells have been completed. However, it should be noted that the adding, comparing, and looping steps for the related cells are implemented during the Time period (e.g. T1) in FIG. 4 when the synapse cell Wd processes the one bit (MSB) of the 3-bit input data. Thus, the whole steps 501 through 519 may be applied to each of the time periods, T2 through T12, as shown in FIG. 4.

Figure 6:
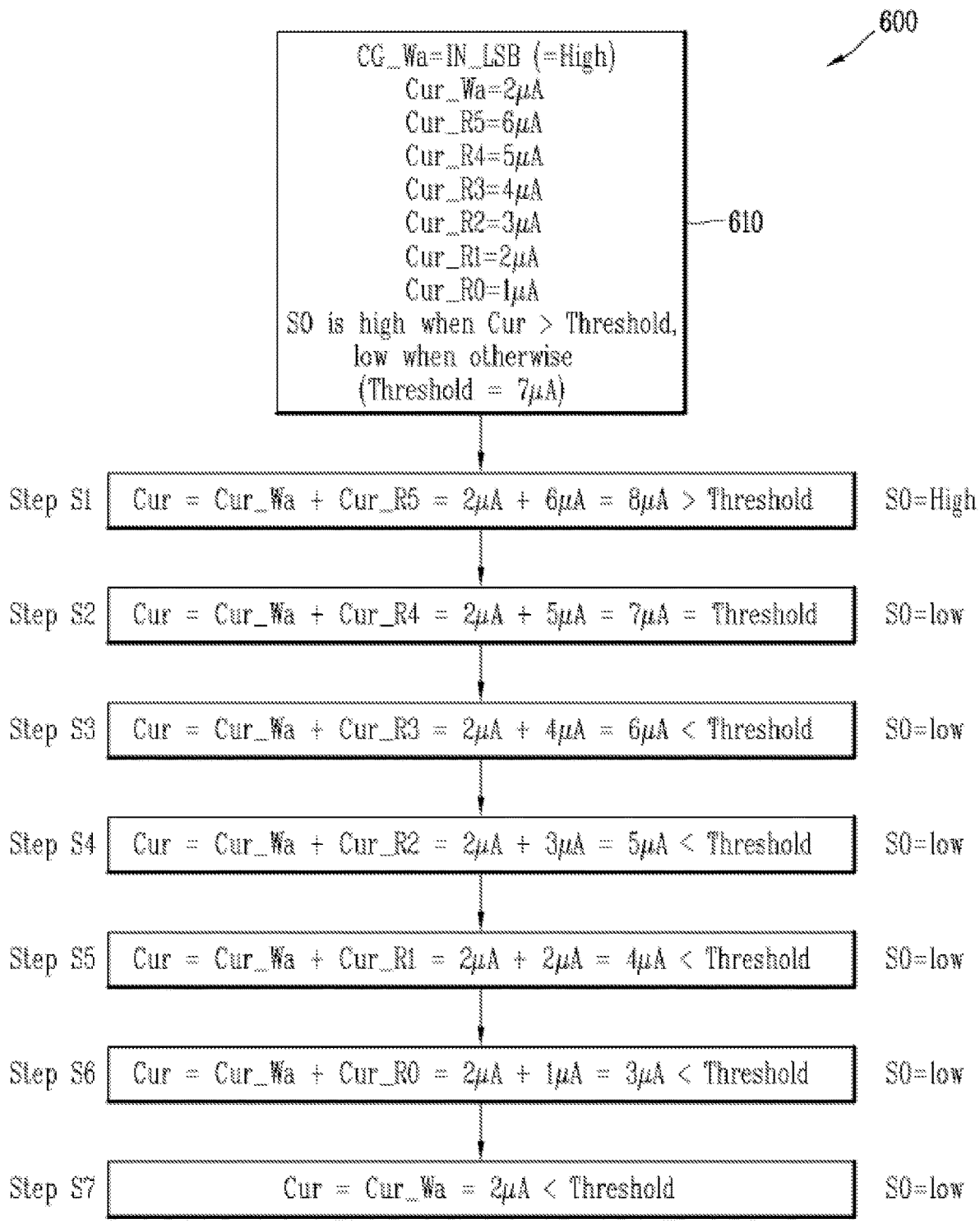
FIG. 6 describes one embodiment of a process of comparing the measured sum of the current in the bitline to the set of preset threshold currents according to the present invention.

FIG. 6 shows a simple example of a serialized current level sensing scheme as shown in FIG. 5. In one embodiment, the Sensing Circuit 140 can be configured to obtain a sum of (i) a current from one of the selected cells in Main Synapse Array 120 and (ii) current from none, one or multiple reference cells in Reference Synapse Array 130 during a preset time period (i.e., t1, t2, t3, . . . ) as recited in FIG. 4. The Sensing Circuit 140 may implement the sum-and-compare step according to the reference synapse levels. The Controller 110 can be further configured to convert the comparison results into a certain binary code specified, in another embodiment of the present invention.

FIG. 6 describes one embodiment of a process of comparing a sum of the output currents in the bitline to the set of preset threshold currents according to the present invention. In FIG. 6 the synapse Array Controller 120 sends IN_LSB bit input voltage value High the selected synapse cell Wa in Synapse row via the control line CG_Wa. And, the cell Wa outputs 2 μA, which is a function of the input High multiplied by two hits of weigh, as shown in FIG. 3. Cur_Wa associated with the synapse cell Wa (i.e., weight bits 0 and 1 of the weight parameter) is 2 μA. A set of the reference synapse cells (R0, R1, R2, R3, R4, and R5) in a reference unit each are implemented using the same type of main synapse cells. Those synaptic cells are coupled to the corresponding reference signal lines (i.e., CG_R0 through CG_R5), connected in parallel with each other, and share the common bitline. Each reference synapse cell outputs a specific reference current on the output line BL because each has specific synaptic weights when receiving a voltage via the corresponding signal line. Here, each of the six reference synaptic reference cells are configured to generate incrementally different currents. For instance, from the top to bottom order in the array, the activated cell R5 is configured to output 6 μA; the activated reference cell R4 can output 5 μA; the activated reference cell R3 can output 4 μA; the activated reference cell R2 can output 3 μA; the activated reference cell R1 can output 2 μA; and, the activated reference cell R0 can output 1 μA. The threshold level of the sense amplifier is defined at 7 μA. The Sensing Circuit 140 output SO is high when the common bitline current Cur is greater than the threshold level. The sensing Circuit 140 output SO is low when the common bitline current Cur is not greater than the threshold level.

At step S1, the Sensing Circuit 140 senses that the summed current value 8 μA (=2 μA of Cur_Wa plus 6 μA of Cur R5) is greater than the reference threshold level 7 μA, and therefore generates the determination result of the binary code High or H. Subsequently, at step S2, the Sensing Circuit 140 then senses that the summed current value 7 μA (=2 μA of Cur_Wa plus 5 μA of Cur R4) is equal to the reference threshold level 7 μA, and therefore generates the determination result of the binary code low or L. Subsequently, at step S3, the Sensing Circuit 140 senses that the summed current value 6 μA (=2 μA of Cur_Wa plus 4 μA of Cur_R3) is less than the reference threshold level 7 μA, and therefore generates the determination result of the binary code L. Subsequently, at step S4, the Sensing Circuit 140 senses that the summed current value 5 μA (=2 μA of Cur_Wa plus 3 μA of Cur R2) is less than the reference threshold level 7 μA, and therefore generates the determination result of the binary code L.

Subsequently, at step S5, the Sensing Circuit 140 senses that the summed current value 4 μA (=2 μA of Cur_Wa plus 2 μA of Cur R1) is less than the reference threshold level 7 μA, and therefore generates the determination result of the binary code L. Subsequently, at step S6, the Sensing Circuit 140 senses that the summed current value 3 μA (=2 μA of Cur_Wa plus 1 μA of Cur R0) is less than the reference threshold level 7 μA, and therefore generates the determination result of the binary code L. Subsequently, at step S7, the Sensing Circuit 140 senses that the summed current value 2 μA (=2 μA of Cur_Wa) is less than the reference threshold level 7 μA, and therefore generates the determination result of the binary code L.

In another embodiment, in this way, BL current level Cur is serially sensed from the Sensing Circuit 140, thus the sequence "HLLLLLL" will be generated through the seven steps. Although one specific sequence for current level Cur in the specific BL is depicted for a specific Sensing Circuit 140 in FIG. 6, each Sensing Circuit 140 may generate a different sequence in each SO node, depending on each BL current level Cur. Then, the thermometer code can be converted to the binary code by counting the number of ones, generating the binary code of "001" for the thermometer code "HLLLLLL" in the column of the array here, since the thermometer code has one high signal. The binary code requires a fewer number of bits to store the same information compared to the thermometer code. Then, this binary code can be appropriately accumulated to the register locations of the Accumulator Circuit 150 with a suitable shift to update the accumulator output (AO).

When the calculation is made between the input LSB (IN_LSB) and the weight bits 0, 1 as illustrated in FIG. 6, no shift of the bits can be made. When the calculation is for the input LSB (IN_LSB), and the weight bits 2, 3, a 2-bit shift can be applied. When the calculation is made between the input LSB (IN_LSB) and weight bits 4,5, a 4-bit can be shifted. When the calculation is for the input LSB (IN_LSB) and the weight bits 6,7, a 6-bit shift can be applied. When the calculation is made between the input CSB (IN_CSB) and the weight bit 0, 1, 1-bit shift can be applied. When the calculation is made between the input CSB (IN_CSB) and the weight bits 2, 3, then a 3-bit shift can be applied. When the calculation is made between the input CSB (IN_CSB) and the weight bits 4,5, a 5-bit shift can be applied. When the calculation is made between the input CSB (IN_CSB) and the weight bits 6,7, a 7-bit shift can be applied. When the calculation is made between the input MSB (IN_MSB) and the weight bits 0, 1, a 2-bit shift can be applied. When the calculation is made between the input MSB (IN_MSB) and the weight bits 2, 3, a 4-bit shift can be applied. When the calculation is made between the input MSB (IN_MSB) and the weight bits 4,5, a 6-bit shift can be applied. When the calculation is made between the input MSB (IN_MSB) and the weight bits 6,7, an 8-bit shift can be applied. For other precision of weight and input bits, accumulation can be similarly conducted serially with appropriate bit shift counts.

Figure 7:
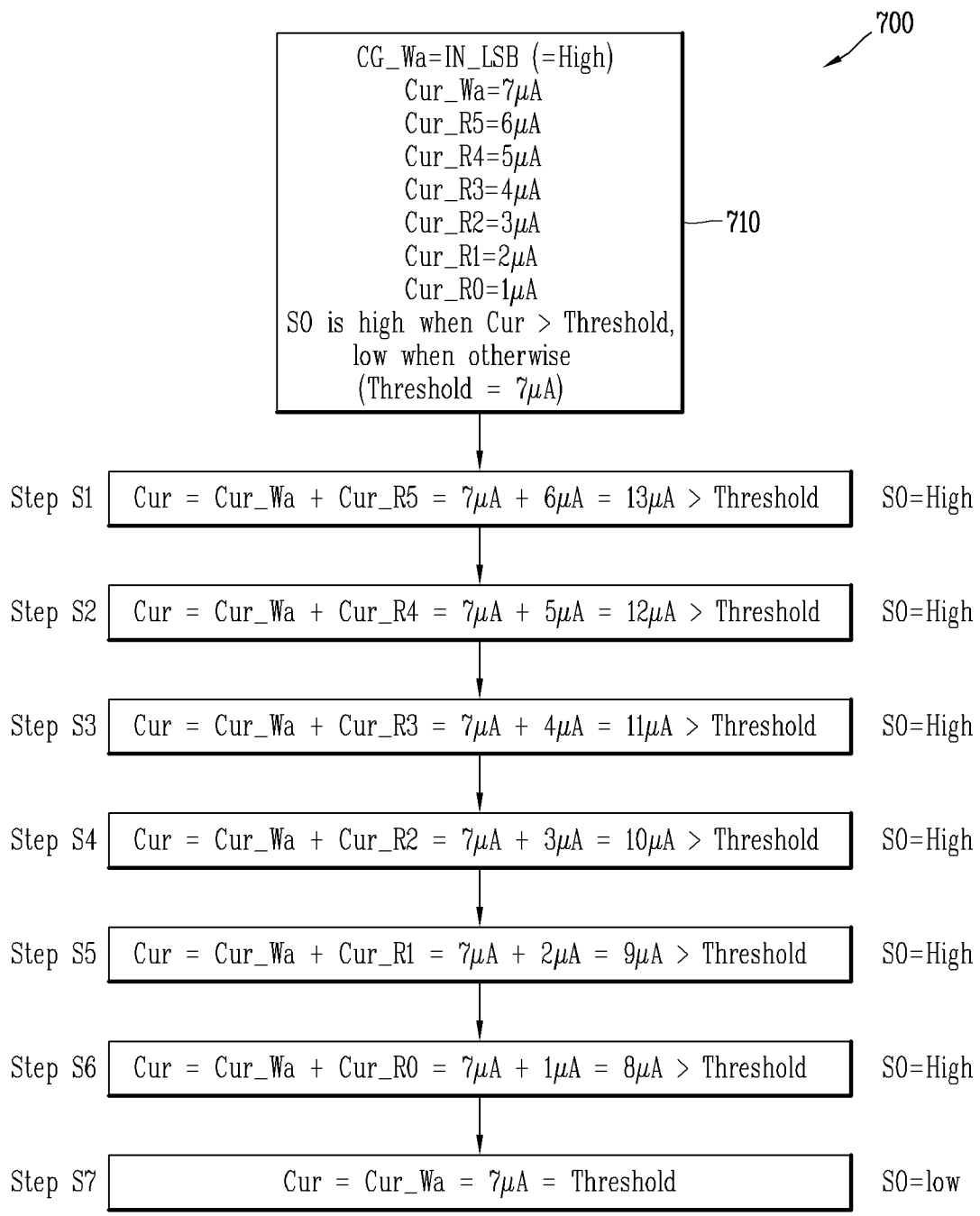
FIG. 7 describes another embodiment of a process of comparing the measured sum of the current in the bitline with the set of preset threshold currents according to the present invention.

FIG. 7 describes another embodiment of a process of comparing a sum of the output currents in the bitline with the set of preset threshold currents according to the present invention. As described in FIG. 6, the Sensing Circuit 140 implements the sum-and-compare steps according to specified reference synapse levels.

At step S1, upon finding that a sum of the output current 13 µA (including the first Reference Synapse Level 6 µA) is greater than the reference threshold level 7 µA, the Sensing Circuit 140 generates a binary code H. Sequentially at step S2, upon finding that a sum of the output current 12 µA (including the second Reference Synapse Level 5 µA) is greater than the reference threshold level 7 µA, the Sensing Circuit 140 generates a binary code H.

Sequentially at step S3, upon finding that a sum of the output current 11 µA (including the third Reference Synapse Level 4 µA) is greater than the reference threshold level 7 µA, the Sensing Circuit 140 generates a binary code H. Sequentially at step S4, upon sensing that a sum of the output current 10 µA (including the fourth Reference Synapse Level 3 µA) is greater than the reference threshold level 7 µA, the Sensing Circuit 140 generates a binary code H.

Sequentially at step S5, upon finding that a sum of the output current 9 µA (including the fifth Reference Synapse Level 2 µA) is greater than the reference threshold level 7 µA, the Sensing Circuit 140 generates a binary code H. Sequentially, at step S6, upon finding that a summed current value of 8 µA (including the sixth Reference Synapse Level 1 µA) is greater than the reference threshold level 7 µA, the Sensing Circuit 140 generates a binary code H. Finally, at Step S7, upon finding that a sum of the output current 7 µA (including the seventh Reference Synapse Level 0 µA) is equal to the reference threshold level 7 µA the Sensing Circuit 140 generates the determination result of the binary code L.

In another embodiment, in this way, BL current level Cur is serially sensed from the Sensing Circuit 140, generating the sequence of "HHHHHHL" through the seven steps. The thermometer code can be converted to the binary code by counting the number of ones, generating the binary code of "110" for the thermometer code of "HHHHHHL" in the column illustrated here since the thermometer code has six high signals. Then, this binary code can be appropriately accumulated to the register locations of the accumulator with a suitable shift to update the accumulator output (AO). When the calculation is for the input LSB (IN_LSB) and the weight bit 0, 1 as illustrated in FIG. 7, no shift can be applied. When the calculation is for the input LSB (IN_LSB) and the weight 2, 3, then a two-bit shift can be applied. When the calculation is for the input LSB (IN_LSB) and the weight 4,5, then a four-bit shift can be applied. When the calculation is for the input LSB (IN_LSB) and the weight 6,7, then a six-bit shift can be applied.

Figure 8:
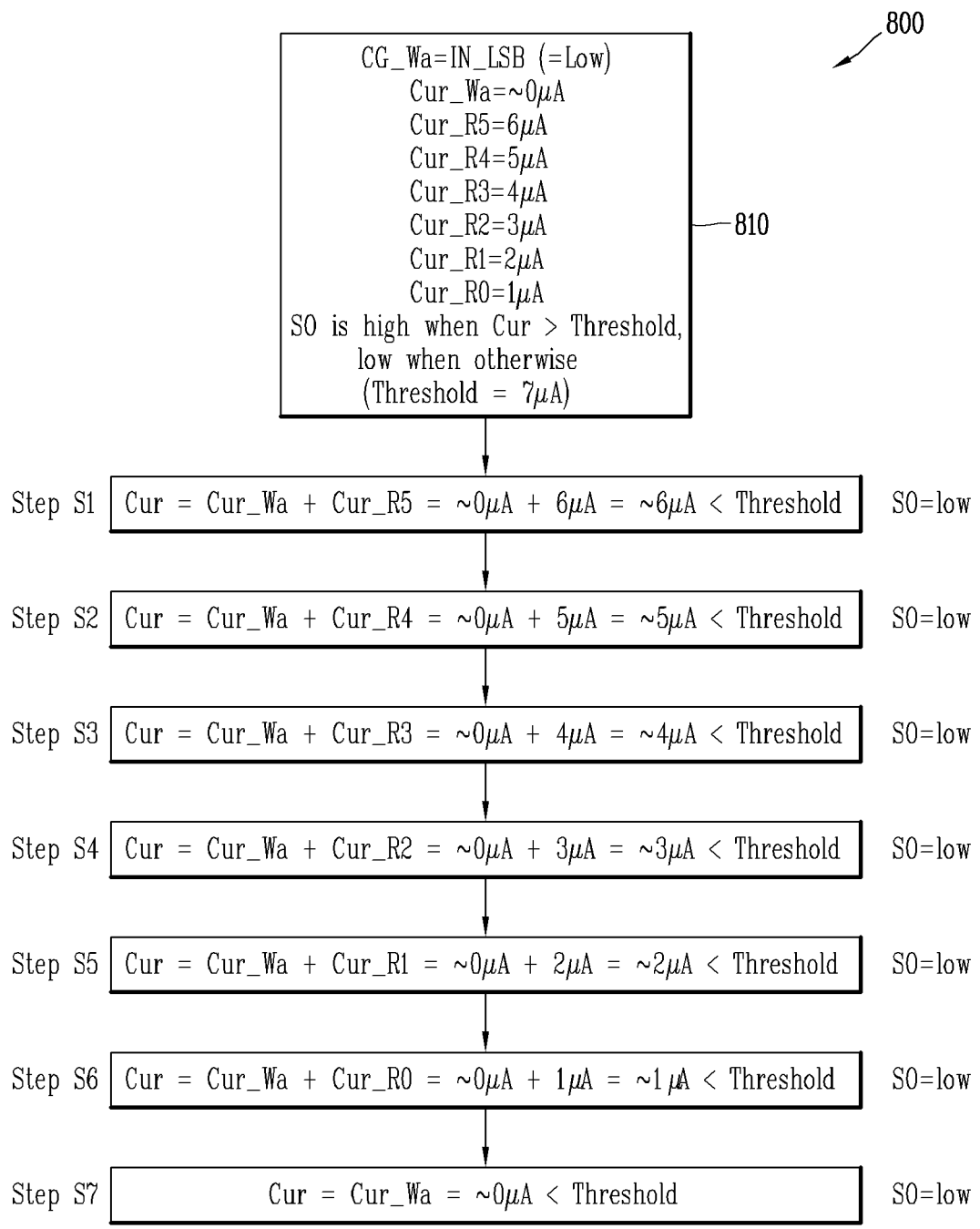
FIG. 8 describes another embodiment of a process of comparing the measured sum of the current in the bitline with the set of preset threshold currents according to the present invention.

FIG. 8 describes another embodiment of a process of comparing the measured sum of the current in the bitline with the set of preset threshold currents according to the present invention. As described in FIGS. 6 and 7, the Sensing Circuit 140 implements the sum-and-compare steps according to specified reference synapse levels. In this case, the synapse Array Controller 120 sends IN_LSB bit input voltage value Low to the synapse cell Wa in Synapse row via the control line CG_Wa. And, the cell Wa outputs of nearly 0 µA, which is a function of the input low multiplied by two hits of weight, as shown in FIG. 3. Cur_Wa is associated with the synapse cell Wa (i.e., weight bits 0 and 1 of the weight parameter).

At step S1, upon finding that the summed output current of nearly 6 µA, which is merely the first Reference Synapse Level 6 µA, is lower than the reference threshold level 7 µA, the Sensing Circuit 140 generates the determination result of the binary code L. Sequentially at step S2, upon finding that the summed current value of nearly 5 µA, which is merely the second Reference Synapse Level 5 µA, less than the reference threshold level 7 µA, the Sensing Circuit 140 generates the determination result of the binary code L.

Sequentially at step S3, upon finding that the summed output current of nearly 4 µA, which is merely the second Reference Synapse Level 4 µA, is less than the reference threshold level 7 µA, the Sensing Circuit 140 generates the determination result of the binary code L. Sequentially at step S4, upon finding that the summed current value of about 3 µA, which is merely the second Reference Synapse Level 3 µA, is less than the reference threshold level 7 µA, the Sensing Circuit 140 generates the determination result of the binary code L.

Sequentially at step S5, upon finding that the summed current value of about 2 µA, which is merely the second Reference Synapse Level 2 µA, is less than the reference threshold level 7 µA, the Sensing Circuit 140 generates the determination result of the binary code L. Sequentially, at step S6, upon finding that the summed current value of about 1 µA, which is merely the second Reference Synapse Level 1 µA, is less than the reference threshold level 7 µA, the Sensing Circuit 140 generates the determination result of the binary code L. Sequentially, at Step S7, upon finding that the summed current value of about 0 µA, which is merely the seventh Reference Synapse Level 0 µA, is less than the reference threshold level 7 µA, the Sensing Circuit 140 generates the determination result of the binary code L.

In another embodiment, in this way, BL current level Cur is serially sensed from the Sensing Circuit 140, generating the sequence of "LLLLLLL" from seven steps as illustrated in FIG. 8. The thermometer code can be converted to the binary code by counting the number of ones, thus generating the binary code of "000" for the thermometer code of "LLLLLLL" because the thermometer code has zero high signal. Then, this binary code may not be added to the register locations of the Accumulator Circuit 150 since the addition does not change the accumulator output AO.

FIG. 9 describes another embodiment of a process of comparing the measured sum of the current in the bitline with the set of preset threshold currents according to the present invention.

In this case, the synapse Array Controller 120 sends IN_LSB bit input voltage value High to the synapse cell Wa in Synapse row via the control line CG_Wa. And, the Reference Synapse Levels are obtained either by none, a single reference cell, or the combination of the reference cells in the Reference Synapse Array 130. The output levels from the reference cells are binary weighted (i.e., Cur R2 is twice of Cur R1, and Cur R1 is twice of Cur R0). When using binary-weighted reference cells, the required number of the reference cells is reduced from six (i.e., Cur R5~Cur R0 as in FIG. 7) to three (Cur R2~Cur R0 in FIG. 9) for the same operation to FIG. 7. This can reduce the required area of the reference cell array, improving the area efficiency of the neural network computing unit.

At step S1, the Sensing Circuit 140 senses that the summed current value 8 µA (including (i) 2 µA of Synapse Cell via Cur_Wa and (ii) 6 µA of Synapse Level 1 obtained by the combination of Reference Cells R2, R1) is greater than the reference threshold level 7 µA and generates the determination result of the binary code H. Subsequently, at step S2, the Sensing Circuit 140 then senses that the summed current value 7 µA (including (i) 2 µA of Synapse Cell via Cur_Wa and (ii) 5 µA of Synapse Level 2 obtained by the combination of Reference Cells R2, R0) is equal to the reference threshold level 7 µA and generates the determination result of the binary code L.

Subsequently, at step S3, the Sensing Circuit 140 senses that the summed current value 6 µA (including (i) 2 µA of Synapse Cell via Cur_Wa and (ii) 4 µA of Synapse Level 3 obtained by a Reference Cell R2) is less than the reference threshold level 7 µA and generates the determination result of the binary code L. Subsequently, at step S4, the Sensing Circuit 140 senses that the summed current value 5 µA (including (i) 2µA of Synapse Cell via Cur_Wa and (ii) 3 µA of Synapse Level 4 obtained by the combination of Reference Cells R1, R0) is less than the reference threshold level 7 µA and generates the determination result of the binary code L.

Subsequently, at step S5, the Sensing Circuit 140 senses that the summed current value 4 µA ((including (i) 2 µA of Synapse Cell via Cur_Wa and (ii) 2 µA of Synapse Level 5 obtained by a Reference Cell R1) is less than the reference threshold level 7 µA and generates the determination result of the binary code L. Subsequently, at step S6, the Sensing Circuit 140 senses that the summed current value 3 µA (including (i) 2 µA of Synapse Cell via Cur_Wa and (ii) 1 µA of Synapse Level 6 obtained by a Reference Cell R0) is less than the reference threshold level 7 µA and generates the determination result of the binary code L. Subsequently, at step S7, the Sensing Circuit 140 senses that the summed current value 2 µA (including 0 µA of Synapse Level 7 obtained by none of the reference cell), which is merely 2 µA of Cur_Wa, is less than the reference threshold level 7 µA and generates the determination result of the binary code L.

In another embodiment, in this way, BL current level Cur is serially sensed from the Sensing Circuit 140, generating the sequence of "HLLLLLL" from seven steps as illustrated in FIG. 9. The thermometer code can be converted to the binary code by simply counting the number of ones, generating the binary code of "001" for the thermometer code of "HLLLLLL" in the column illustrated since the thermometer code has one high signal. Then, this binary code can be appropriately accumulated to the register locations of the accumulator with a suitable shift to update the accumulator output (AO). When the calculation is for the input LSB (IN_LSB) and the weight bit 0, 1 as illustrated in FIG. 9, no shift can be applied. When the calculation is for the input LSB (IN_LSB) and the weight 2, 3, then a two-bit shift can be applied. When the calculation is for the input LSB (IN_LSB) and the weight 4,5, then a four-bit shift can be applied. When the calculation is for the input LSB (IN_LSB) and the weight 6,7, then a six-bit shift can be applied.

What is claimed is:

1. A neural network computing unit, comprising:
a bit line;
a memory array having a plurality of memory blocks, each memory block has one or more memory cells, each memory cell connected to the bit line; and
a control circuit configured to:
enable the one or more memory cells in a first memory block to receive serialized digital inputs sequentially and produce corresponding outputs, wherein each output represents a multiplication of each serialized digital input and a weight value stored in each of the one or more memory cells; and
set a group of reference current levels for the one or more memory cells in a second memory block, each having a specific current amount,
wherein the control circuit controls the one or more memory cells in the second memory block in generating respective output currents corresponding to the set of reference current levels; and
wherein the one or more memory cells in the second memory block are activated by serialized digital input bits respectively during a period when each memory cell in the first memory block is activated by one digital input.

2. A neural network computing unit of claim 1, wherein the control circuit is further configured to apply serialized digital voltage inputs, corresponding to the serialized digital inputs, to the memory cells in the first memory block in a sequence such that each of the output currents of the memory cell is produced in a sequence corresponding to the serialized digital voltage input, wherein the output current corresponds to the multiplication of the digital voltage input and a weight value stored in each of the one or more the memory cells.

3. A neural network computing unit of claim 2, wherein the neural network computing unit further comprises a sensing circuit for sequentially receiving output currents of the memory cells in the bit line.

4. A neural network computing unit of claim 3, wherein the neural network computing unit further comprises an accumulator circuit coupled to the sensing circuit, and the accumulator circuit is configured to convert the received output current values in a thermometer code to a binary code.

5. A neural network computing unit of claim 4, the accumulator circuit is further configured to accumulate the converted values in a bit-shifted manner defined by the control circuit.

6. The neural network computing unit of claim 2, wherein the one or more memory cells in the first block on a same column of the memory array connected to the bit line.

7. The neural network computing unit of claim 6, wherein a most significant bit of the serial digital input data is first entered into a corresponding one of the one or more memory cells in the first block.

8. The neural network computing unit of claim 7, wherein the neural network computing unit finishes computation without fully computing the least significant bit.

9. The neural network computing unit of claim 6,
wherein the one or more memory cells in the second block on a same column of the memory array share the bit line, the one or more memory cells programmed to generate same or different respective output currents to the bit line; and
the control circuit is further configured to:

enable the one or more memory cells in the second block to receive serialized digital input bits sequentially and produce corresponding outputs.

10. The neural network computing unit of claim 9, wherein the control circuit is further configured to deactivate or activate none, one, or multiple memory cells in the second block to produce respective outputs corresponding to reference levels defined by the control circuit.

11. The neural network computing unit of claim 9, wherein the output currents from the memory cells in the second block are binary weighted.

12. A neural network computing unit of claim 3, wherein the sensing circuit is further configured to sense a sum of an output current of the one or more memory cells in the first block and output currents of the one or more memory cells in the second memory blocks.

13. The neural network computing unit of claim 12, the sensing circuit is further configured to obtain a sum of (i) an output current of the each of the one or more memory cell corresponding to one bit of the serial input data applied to the first memory block and (ii) an output current of each of the one or more memory cells corresponding to each of reference levels defined by the control circuit.

14. The neural network computing unit of claim 13, the sensing circuit is further configured to:
obtain the summed output currents in the bit line;
produce a comparison result between a threshold current level specified and a level of the obtained sum of output currents; and,
convert the comparison result into a corresponding binary signal.

15. The neural network computing unit of claim 14, the sensing circuit is further configured to set a number of iterations of (i) comparison between the threshold current level and the summed output current level and (ii) converting the comparison result into the corresponding binary signal.

16. An apparatus, comprising:
an array of memory cells, including:
a bit line;
a first set of memory cells, each connected to the bit line;
a second set of memory cells, each connected to the bit line;
a control circuit;
a first set of control lines connecting the control circuit to the first set of memory cells, wherein the control circuit is configured to apply a voltage input data in a serial format to the first set of memory cells in a sequence such that output currents are produced in a sequence in response to the voltage input data, wherein each of the output currents corresponds to a multiplication of the voltage input data and a weight stored in each of the first set of memory cells;
a second set of control lines connecting the control circuit to the second set of memory cells, wherein the control circuit is configured to set a group of reference levels, each having a specific current amount, such that the second set of memory cells generate respective output currents corresponding to the group of reference current levels; and
a sensing circuit for receiving output currents from the first and second set of memory cells in the bit line wherein one or more memory cells of the second set of memory cells are activated by serialized digital input bits respectively during a period when each memory cell in the first memory block is activated by one digital input.

17. The apparatus of claim 16, wherein the memory cell of the first and second sets of memory cells is a Flash memory, a resistive change memory, a FeFET memory, or a logic transistor with a weight memory, each programmed to produce a certain output current predefined.

18. The apparatus of claim 16 further comprises an accumulator circuit coupled to the sensing circuit, wherein the accumulator circuit is configured to receive processed signal values from the sensing circuit in a bit-shifted manner defined by the control circuit.

19. The apparatus of claim 16, wherein the sensing circuit is further configured to serially receive and compare a respective one of the output currents in the bit line with a threshold predefined.

20. The apparatus of claim 18, wherein the accumulator circuit is further configured to perform converting received signal values from a thermometer code to a binary code and accumulates the converted binary code in a bit-shifted manner defined by the control circuit.

* * * * *